United States Patent [19]
Teich et al.

[11] Patent Number: 5,371,508
[45] Date of Patent: Dec. 6, 1994

[54] PORTABLE ANTENNA TEST APPARATUS

[75] Inventors: Stanley Teich, Melville; Doru Roll-Mecak, Long Beach; Morton Kommel, Dix Hills, all of N.Y.

[73] Assignee: Grumman Aerospace Corporation, Bethpage, N.Y.

[21] Appl. No.: 14,336

[22] Filed: Feb. 5, 1993

[51] Int. Cl.$^5$ .................. G01R 29/10; H01Q 1/28
[52] U.S. Cl. ...................... 343/703; 343/705
[58] Field of Search ............ 343/703, 705; 342/173; H01Q 1/28

[56] References Cited

U.S. PATENT DOCUMENTS

| | | | |
|---|---|---|---|
| 3,153,760 | 10/1964 | Henderson | 343/703 X |
| 3,879,733 | 4/1975 | Hansen et al. | 343/703 X |
| 4,118,668 | 10/1978 | Strayer, Jr. | 343/703 X |
| 4,578,680 | 3/1986 | Haupt | 343/703 X |
| 4,754,496 | 6/1988 | Fishkin et al. | 343/703 X |

FOREIGN PATENT DOCUMENTS 1552132  3/1990  U.S.S.R. .................... 343/703 X

*Primary Examiner*—Donald Hajec
*Assistant Examiner*—Tan Ho
*Attorney, Agent, or Firm*—Collard & Roe

[57] ABSTRACT

Portable antenna test apparatus has a test set positioned a determined distance from a number of antennas of an aircraft. A transmitting module of the test set contains low frequency, mid frequency, and high frequency antennas connected to a radio receiver and power amplifier in and of the test set for receiving control commands and for transmitting a number of simultaneous test signals to the number of antennas in the aircraft. A signal generator produces low frequency, mid frequency and high frequency signals. A hand-held computer is connected to a communications radio in and of the aircraft via a radio interface adapter of the hand-held computer and a control computer is connected to the signal generator. The hand-held computer transmits commands via the aircraft radio, which commands are received by the receiver in the transmitting module. This receiver conveys the commands to the control computer which then programs the signal generator. By this means, an operator in the aircraft cockpit remotely controls the signal generator.

26 Claims, 3 Drawing Sheets

PORTABLE ANTENNA TEST APPARATUS

BACKGROUND OF THE INVENTION

1. Field of the Invention

The present invention relates to an antenna test apparatus. More particularly, the invention relates to a portable antenna test apparatus.

2. Prior Art

Portable antenna test sets presently in use do not cover all communications and radar frequency bands in one test set, and existing portable antenna test sets generate one test signal at a time and thus must sequentially generate test signals over a long period of time in order to cover all frequency bands of interest. Also, portable antenna test sets presently in use do not have sufficient output signal power and are thus limited in range. No portable antenna test sets in use are remote controlled and such antenna test sets require several operators to conduct a test. Existing portable antenna test sets also do not provide for the remote control of test signal parameters. Furthermore, portable antenna test sets presently in use allow for limited control over signal parameters, and none allow for changing of the test signal frequency, pulse width, pulse repetition interval (PRI) and amplitude level in the interval between two successive pulses.

SUMMARY OF THE INVENTION

The principal object of the invention is to provide portable antenna test apparatus capable of testing a plurality of antennas in all of their operating frequency bands simultaneously.

An object of the invention is to provide portable antenna test apparatus having a thousand foot test range.

Another object of the invention is to provide portable antenna test apparatus which covers all communications and radar frequency bands in one test set.

Still another object of the invention is to provide portable antenna test apparatus which generates a plurality of test signals simultaneously, thereby greatly reducing the test time, and to test the receiving system for handling multiple signals simultaneously.

Yet another object of the invention is to provide portable antenna test apparatus which functions efficiently, effectively and reliably to test a plurality of antennas.

Another object of the invention is to provide portable antenna test apparatus which may be remotely controlled by a single operator via remote control.

Still another object of the invention is to provide portable antenna test apparatus which permits any test signal parameter on any channel to be changed by remote control.

Yet another object of the invention is to provide portable antenna test apparatus which may be remotely controlled from an aircraft cockpit by a single operator.

Another object of the invention is to provide portable antenna test apparatus which permits any test signal parameter on any channel to be changed by remote control from the cockpit of an aircraft.

Still another object of the invention is to provide portable antenna test apparatus capable of pulse-to-pulse changing of pulse width and PRI parameters.

Yet another object of the invention is to provide portable antenna test apparatus having a programmable RF power level which is remotely controlled in each band.

Another object of the invention is to provide portable antenna test apparatus which permits the simultaneous testing of different communications receiving systems with different sensitivities and operating in different frequency bands.

Still another object of the invention is to provide portable antenna test apparatus capable of testing a plurality of antennas which contain built-in signal downconversion circuity.

Yet another object of the invention is to provide portable antenna test apparatus capable of simultaneously testing a plurality of antennas and the plurality of receivers to which these antennas are electrically connected while said antennas and receivers are installed in an aircraft.

Another object of the invention is to provide portable antenna test apparatus which permits the measuring of antenna beam patterns while the antennas under test are installed in an aircraft.

Still another object of the invention is to provide portable antenna test apparatus capable of testing antennas and receivers which are part of a direction finding apparatus which is installed in an aircraft.

Yet another object of the invention is to provide portable antenna test apparatus capable of testing antennas and receivers which are part of a radar apparatus which is installed in an aircraft.

Another object of the invention is to provide portable antenna test apparatus which can be operated either manually or automatically by preloaded test software.

Still another object of the invention is to provide portable antenna test apparatus capable of being operated manually by manually entering commands into a built-in computer via a built-in keyboard device.

Yet another object of the invention is to provide portable antenna test apparatus capable of being operated manually via remote control by manually entering commands into a hand-held remote control computer.

BRIEF SUMMARY OF THE INVENTION

In accordance with the invention, portable antenna test apparatus for testing a plurality of antennas in all of their frequency bands simultaneously, said plurality of antennas including a communications antenna and a communications radio to which said communications antenna is electrically connected, comprises a test set positioned a determined distance from the plurality of antennas and a hand-held computer to remotely control said test set. The computer has a communications radio interface adapter which is electrically connected between the computer and the communications radio.

The test set comprises a control computer, a signal generator, and a transmitting module, all of which are interconnected. The signal generator comprises a digital input/output (I/O) card, a low frequency module, a low band module, a high band upconverter module, a modulation module and a power supply, all of which are interconnected. The transmitting module comprises a low band antenna, a mid band antenna, a high band antenna, a power amplifier and a radio receiver, all of which are interconnected.

In accordance with the invention, portable antenna test apparatus for testing a plurality of antennas installed in an aircraft in all of their frequency bands simultaneously, comprises a hand-held computer having a radio interface adapter which is electrically connected between the hand-held computer a communications radio. The radio is electrically connected to a communications antenna, which is part of the plurality of antennas. A test set positioned a determined distance from the plurality of antennas comprises a transmitting module which contains a radio receiver for receiving the control signals sent by the hand-held computer via the communications radio and the communications antenna, a signal generator which generates the test signals and a control computer, all of which are interconnected. The control computer receives commands from the hand-held computer via the radio receiver located in the transmitting module and programs the signal generator for proper output. The signal generator receives command functions from the control computer via the digital I/O card, which has a plurality of outputs electrically connected to the low frequency module, the low band module, the high band upconverter module and the modulation module. The modules are also interconnected. The modulation module provides a test signal output electrically connected to the power amplifier of the transmitting module. The power amplifier is electrically connected to the low, mid and high band antennas. These antennas emit a test signal which is radiated at the plurality of antennas installed in the aircraft.

BRIEF DESCRIPTION OF THE DRAWINGS

In order that the invention may be readily carried into effect, it will now be described with reference to the accompanying drawings, wherein.

DETAILED DESCRIPTION OF PREFERRED EMBODIMENT

Figure 1:
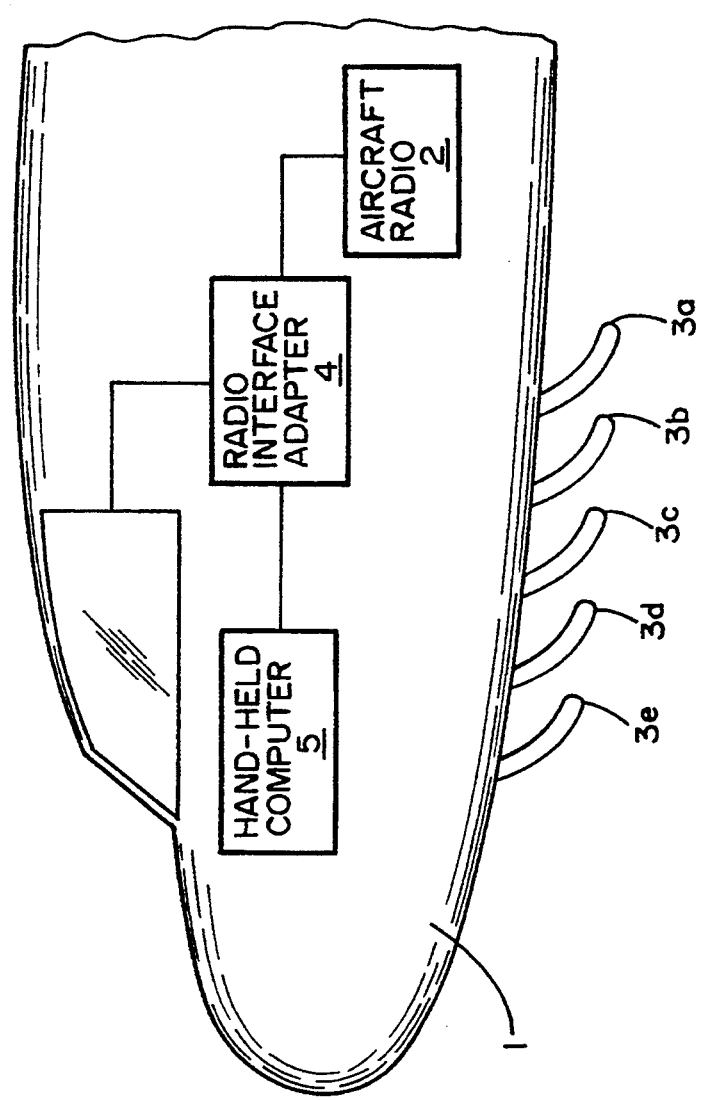
FIG. 1 is a block diagram illustrating the positioning of the remote control of the portable antenna test apparatus of the invention in an aircraft cockpit.

The portable antenna test apparatus of the invention is used for testing a plurality of antennas such as, for example, the antennas of an aircraft 1, in all of their respective frequency bands simultaneously (FIG. 1). The aircraft 1 has a communications radio 2 (FIGS. 1 and 2) which is electrically connected to a communications antenna 3a (FIGS. 1 and 2) which is part of the plurality of antennas 3b, 3c, 3d and 3e. A radio interface adapter 4 (FIGS. 1 and 2) is electrically connected to the communications radio 2 and is part of a hand-held computer 5 (FIGS. 1 and 2) of any suitable known type, which is part of, and a remote control for, the portable antenna test apparatus of the invention.

The portable antenna test apparatus of the invention comprises a test set positioned a determined distance from the plurality of antennas installed in the aircraft 1. This distance may be as great as 1,000 feet. The test set comprises a transmitting module 6 (FIG. 2) electrically connected to a signal generator 7. The signal generator 7, the embodiment of which is shown in FIG. 3, produces the required test signals, which are conveyed to the transmitting module 6 via a plurality of inputs/outputs 8. The signal generator 7 has a plurality of inputs-/outputs 9, electrically connected to a control computer 10 (FIG. 2) of any suitable known type.

Figure 2A:
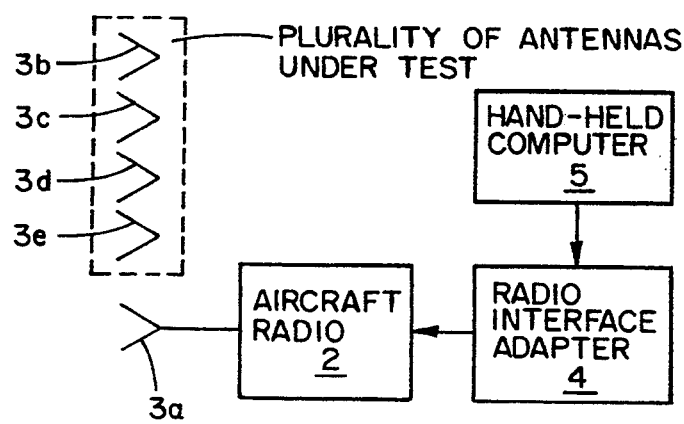
FIG. 2 is a block diagram of an embodiment of the portable antenna test apparatus of the invention.
Figure 2B:
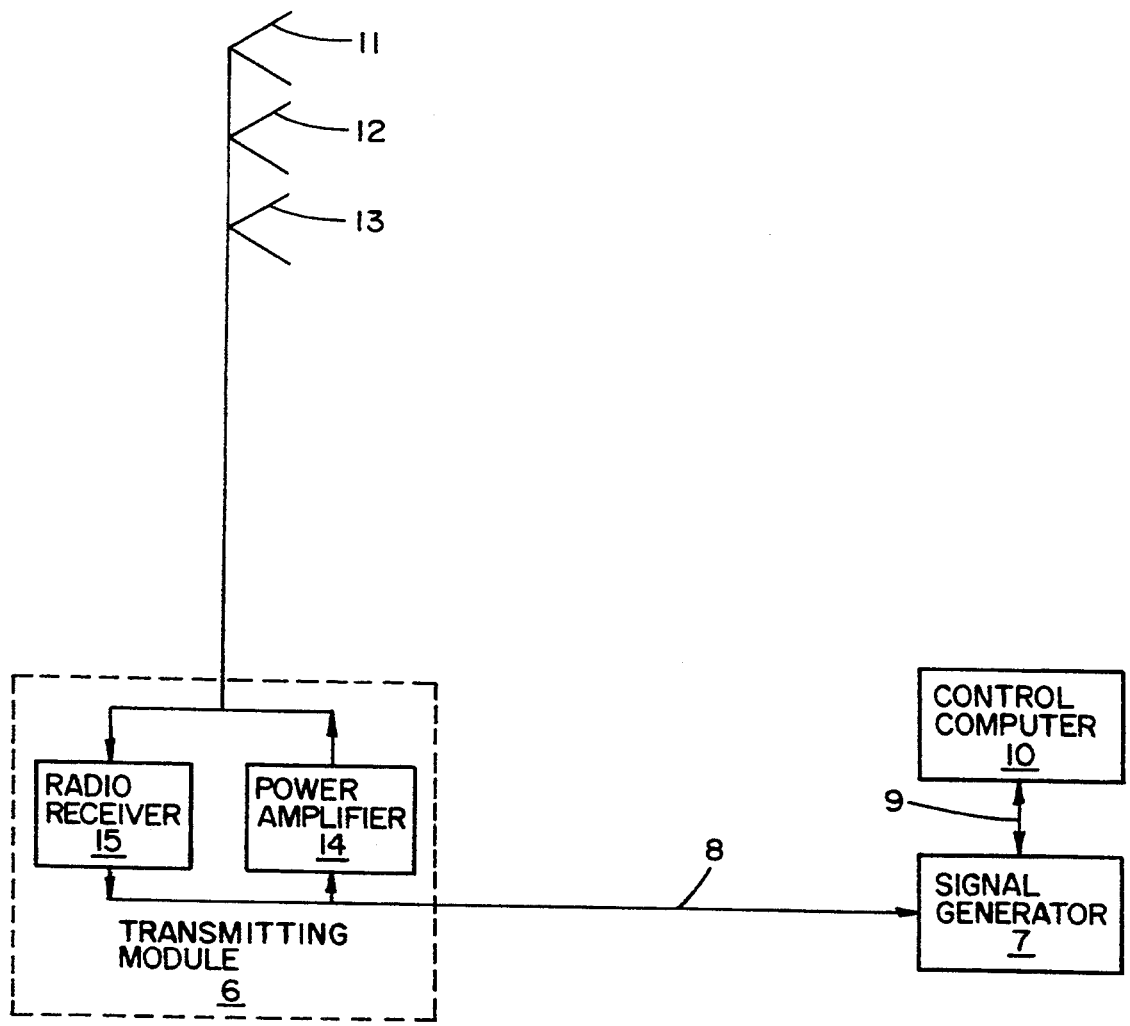
Figure 3:
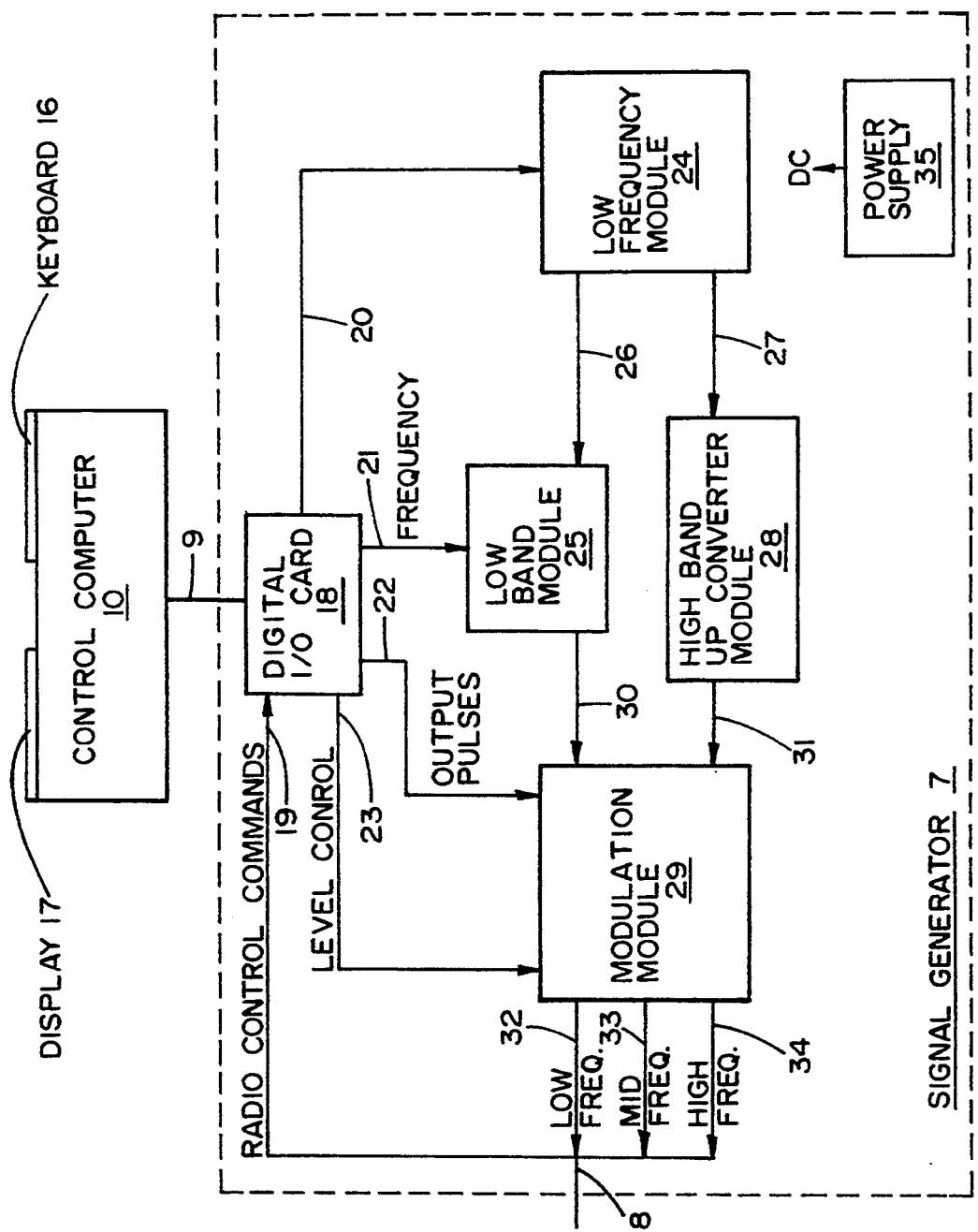
FIG. 3 is a block diagram of an embodiment of the signal generator of the portable antenna test apparatus of the invention.

In the embodiment of FIG. 2, the transmitting module 6 comprises test antennas 11, 12 and 13 of any suitable known type electrically connected to a power amplifier 14 of any suitable known type. The power amplifier 14 is electrically connected to the signal generator 7 and a radio receiver 15 of any suitable known type electrically connected to the control computer 10 via the plurality of inputs/outputs 8. The control computer 10 comprises any suitable known type having a keyboard 16 and a display or screen 17 (FIG. 3). The control computer 10 is electrically connected to the signal generator 7 via the plurality of inputs/outputs 9. The control computer 10 controls the signal generator 7 and the transmitting module 6.

In the embodiment of FIG. 3, the signal generator 7 comprises a digital I/O card 18 of any suitable known type, electrically connected to the control computer 10 by means of the plurality of inputs/outputs 9. The digital I/O card has a plurality of outputs 20, 21, 22 and 23, each of which provides a plurality of control signals for the control of test signal frequency, pulse width, PRI and amplitude parameters. The digital I/O card 18 has an output 19 which is electrically connected to the plurality of inputs/outputs 8.

The control computer 10 receives commands from the hand-held computer 5 via the radio receiver 15 located in the transmitting module 6 and programs the signal generator 7 for proper output. The signal generator 7 receives command functions from the control computer 10 via the digital I/O card 18, which has a plurality of outputs electrically connected to the low frequency module, the low band module, the high band up converter module and the modulation module 29. The modules are also interconnected. The modulation module 29 provides a test signal output which is electrically connected to the power amplifier 14 located in the transmitting module. The power amplifier 14 is electrically connected to the low, mid and high band antennas. These antennas emit a test signal which is radiated at the plurality of antennas $3a + 3e$ installed in the aircraft 1.

A low frequency module 24 of any suitable known type is electrically connected to the output 20 of the digital input/output card 18 and a low band module 25 of any suitable known type is electrically connected to the output 21 of said digital input/output card (FIG. 3). The low frequency module 24 has an output 26 electrically connected to an input of the low band module 25 and an output 27 electrically connected to an input of a high band up converter module 28 of any suitable known type (FIG. 2). A modulation module or modulator 29 of any suitable known type has an input 30 electrically connected to an output of the low band module 25 and an input 31 electrically connected to an output of the high band up converter module 28 and receives the level control signals and output pulses provided at the outputs 23 and 22 of the digital input/output card 18.

The modulation module 29 provides signals of desired frequency, amplitude and modulation under the control of the control computer 10. Thus, low frequency signals are provided at an output 32, mid frequency signals are provided at an output 33 and high frequency signals are provided at an output 34.

The portable antenna test apparatus of the invention provides eight test signals simultaneously, thereby considerably reducing test time. One to eight simultaneous or pseudo-simultaneous channels are provided. Continuous wave (CW), pulsed CW and digital FSK signals in a wide frequency range of VHF to Ku, which covers communications and radar, are provided at a frequency accuracy of ±1 MHz and a frequency resolution of 1

MHz. The test signals have a pulse width of 50 nanoseconds to 50 milliseconds, a pulsewidth resolution of 50 nanoseconds and a PRI of 100 nanoseconds to 50 milliseconds.

The signal generator 7 is powered by a power supply 35 of any suitable known type which is electrically connected to the components of said signal modulator and supplies DC thereto.

The control functions provided by the control computer 10 control frequency, pulsewidth, PRI and the power level of the signals provided by the signal generator 7. The power level is programmable to approximately one watt, in one Db steps on each channel. The pulse-to-pulse pulsewidth and PRI agility is programmable and the signals are modulated FM or AM on each channel. The plurality of antennas 3a, 3b, 3c, 3d and 3e may be located in a naval vessel, a submersible vehicle, a land vehicle, a space vehicle, or in a building or communications tower, as well as in an aircraft.

The signal generator 7 is capable of individually controlling and changing the test signal parameters in the interval between two successive pulses. This enables the frequency of the test signal to be changed in the interval between two successive pulses. It also enables the pulse width of the test signal to be changed in the interval between two successive pulses, enables the PRI of the test signal to be changed in the interval between two successive pulses and enables the amplitude of the test signal to be changed in the interval between two successive pulses.

While a single embodiment of the present invention have been shown and described, it is to be understood that many changes and modifications may be made thereunto without departing from the spirit and scope of the invention as defined in the appended claims.

What is claimed is:

1. Portable antenna test apparatus for testing a plurality of antennas in all of their frequency bands simultaneously, said plurality of antennas including a communications antenna and a communications radio electrically connected to said communications antenna, said antenna test apparatus comprising:
   a hand-held computer having a radio interface adapter which is electrically connected between the computer and the communications radio;
   remote controlled test set means positioned a determined distance from said plurality of antennas, which comprises:
   transmitting means for receiving control commands and for transmitting a plurality of simultaneous test signals to said plurality of antennas;
   signal generating means for producing test signals and individually controlling and changing the signal parameters in the interval between two successive pulses, said signal generating means having a plurality of outputs connected to said transmitting means and having an input; and
   control computer means connected to said transmitting means and the input of said signal generating means for controlling said signal generating means, whereby the plurality of antennas are tested in all their frequency bands simultaneously.

2. Portable antenna test apparatus as claimed in claim 1, wherein said signal generating means is capable of individual control and change of the frequency, the pulse width, the PRI and the amplitude of the test signal in the interval between two successive pulses.

3. Portable antenna test apparatus as claimed in claim 1, wherein said control computer means comprises a personal computer.

4. Portable antenna test apparatus as claimed in claim 1, wherein said test set means comprises a radio receiver, a power amplifier, and low, mid and high band antennas.

5. Portable antenna test apparatus as claimed in claim 1, wherein said transmitting means comprises a transmitting module.

6. Portable test apparatus as claimed in claim 1, wherein said signal generating means is capable of individually controlling and changing the test signal parameters in the interval between two successive pulses, whereby each of the frequency, the pulse width, the PRI, and the amplitude of the test signal can be changed in the interval between two successive pulses.

7. Portable antenna test apparatus as claimed in claim 1, wherein said signal generating means can be controlled by manual entry of test signal parameters into the control computer via a keyboard device, said manual entry of parameters constituting local control of said apparatus.

8. Antenna test apparatus as claimed in claim 1, wherein said apparatus is in a fixed installation.

9. Apparatus as claimed in claim 1, wherein said apparatus is used to test a receiver or receivers, or part thereof, connected to said plurality of antennas.

10. Portable antenna test apparatus for testing a plurality of antennas of an aircraft in all frequency bands simultaneously, said aircraft having a communications radio having a communications radio antenna and a radio interface adapter, said antenna test apparatus comprising:
   a remote controlled test set positioned a determined distance from said plurality of antennas;
   transmitting means containing low frequency, mid frequency and high frequency antennas for receiving control commands and for transmitting a plurality of simultaneous test signals to said plurality of antennas;
   signal generating means for producing test signals and individually controlling and changing the signal parameters in the interval between two successive pulses, said generating means having an input and having a plurality of outputs connected to said transmitting means; and
   a hand-held computer connected to said radio interface adapter and said communications radio for remotely controlling said signal generating means, whereby the plurality of antennas are tested in all their frequency bands simultaneously.

11. Portable antenna test apparatus as claimed in claim 10, wherein said transmitting means comprises a radio receiver and a power amplifier connected to each other.

12. Apparatus as claimed in claim 10, wherein said plurality of antennas are located in a naval vessel.

13. Apparatus as claimed in claim 10, wherein said plurality of antennas are located in a submersible vehicle.

14. Apparatus as claimed in claim 10, wherein said plurality of antennas are located in a land vehicle.

15. Apparatus as claimed in claim 10, wherein said plurality of antennas are located in a space vehicle.

16. Portable antenna test apparatus as claimed in claim 10, wherein the plurality of antennas are in one of a building and communications tower.

17. Portable antenna test apparatus for testing a plurality of antennas in all of their frequency bands simultaneously, said plurality of antennas including a communications antenna and a communications radio electrically connected to said communications antenna, said antenna test apparatus comprising:
  a remote controlled test set positioned a determined distance from said plurality of antennas;
  hand-held computer means for remotely controlling said test set;
  transmitting means for receiving control commands and for transmitting a plurality of simultaneous test signals to said plurality of antennas;
  signal generating means for producing test signals and individually controlling and changing the signal parameters in the interval between two successive pulses, said signal generating means being electrically connected to said test set; and
  control computer means for controlling the signal generating means, whereby the plurality of antennas are tested in all their frequency bands simultaneously.

18. Apparatus as claimed in claim 10, wherein said hand-held computer includes a communications radio interface adapter electrically connected to said communications radio.

19. Apparatus as claimed in claim 17, wherein said test set comprises the control computer, said signal generating means and the transmitting means, electrically connected to each other.

20. Apparatus as claimed in claim 19, wherein said transmitting means comprises a low band antenna, a mid band antenna, a high band antenna, a power amplifier and a radio receiver, all electrically connected to each other.

21. Portable antenna test apparatus for testing a plurality of antennas installed in an aircraft in all of their frequency bands simultaneously, said plurality of antennas including a communications antenna and a communications radio electrically connected to said communications antenna, said antenna test apparatus comprising:
  a hand-held computer having a radio interface adapter electrically connected between the hand-held computer and the communications radio;
  a remote controlled test set positioned a determined distance from said plurality of antennas, said test set comprising a transmitting module having a radio receiver for receiving control signals sent by said hand-held computer via said communications radio and said communications antenna and having a power amplifier;
  signal generating means for generating test signals and individually controlling and changing the test parameters in the interval between two successive pulses; and
  a control computer electrically connected to said signal generating means, said control computer receiving commands from said hand-held computer via said radio receiver of said transmitting module and programming said signal generating means for selected output, whereby the plurality of antennas are tested in all their frequency bands simultaneously.

22. Portable antenna test apparatus for testing a plurality of antennas in all of their frequency bands simultaneously, said antenna test apparatus comprising
  remote controlled test set means positioned a determined distance from said plurality of antennas, said test set means including transmitting means for receiving control commands and for transmitting a plurality of simultaneous test signals to said plurality of antennas;
  signal generating means for producing test signals and individually controlling and changing the test signal parameters in the interval between two successive pulses, said signal generating means having a plurality of outputs connected to said transmitting means and having an input; and
  control computer means connected to said transmitting means and the input of said signal generating means for controlling said signal generating means, whereby the plurality of antennas are tested in all their frequency bands simultaneously.

23. Portable antenna test apparatus for testing a plurality of antennas in all of their frequency bands simultaneously, said plurality of antennas including a communications antenna and a communications radio electrically connected to said communications radio, said antenna test apparatus comprising:
  a hand-held computer electrically connected to a radio interface adapter which is electrically connected to the communications radio;
  test set means positioned a determined distance from said plurality of antennas, which comprises:
  transmitting means for receiving control commands and for transmitting a plurality of simultaneous test signals to said plurality of antennas;
  signal generating means for producing test signals, said signal generating means having a plurality of outputs connected to said transmitting means and having an input, said signal generating means comprising a digital input/output card connected to said control computer and having an input connected to said transmitting means, said digital input/output card having a plurality of outputs, low frequency means connected to outputs of said digital input/output card, high frequency means connected to said low frequency means and a modulator connected to outputs of said digital input/output card and to said low frequency and high frequency means; and
  control computer means connected to said transmitting means and the input of said signal generating means for controlling said signal generating means.

24. Portable antenna test apparatus for testing a plurality of antennas of an aircraft in all frequency bands simultaneously, said aircraft having a communications radio having a communications radio antenna and a radio interface adapter, said antenna test apparatus comprising:
  a test set positioned a determined distance from said plurality of antennas;
  transmitting means containing low frequency, mid frequency and high frequency antennas for receiving control commands and for transmitting a plurality of simultaneous test signals to said plurality of antennas;
  signal generating means for producing test signals, said generating means having an input and having a plurality of outputs connected to said transmitting means, said signal generating means comprising a digital input/output card connected to said computer and having an input connected to said transmitting means, said digital input/output card having a plurality of outputs, low frequency means connected to outputs of said digital input/output card, high frequency means connected to said low frequency means and a modulator connected to outputs of said digital input/output card and to said low frequency and high frequency means and said transmitting means; and a computer connected to said radio interface adapter and said communications radio for remotely controlling said signal generating means.

25. Portable antenna test apparatus for testing a plurality of antennas in all of their frequency bands simultaneously, said plurality of antennas including a communications antenna and a communications radio electrically connected to said communications antenna, said antenna test apparatus comprising:

a test set positioned a determined distance from said plurality of antennas;

a hand-held computer means for remotely controlling said test set; and signal generating means for producing test signals, said signal generating means being electrically connected to said test set, said signal generating means comprising a digital input/output card, a low frequency module, a low band module, a high band up converter module, a modulation module and a power supply, all electrically connected to each other.

26. Portable antenna test apparatus for testing a plurality of antennas installed in an aircraft in all of their frequency bands simultaneously, said plurality of antennas including a communications antenna and a communications radio electrically connected to said communications antenna, said antenna test apparatus comprising:

a hand-held computer having a radio interface adapter electrically connected to said communications radio;

a test set positioned a determined distance from said plurality of antennas, said test set comprising a transmitting module having a radio receiver for receiving control signals sent by said hand-held computer via said communications radio and said communications antenna and having a power amplifier;

signal generating means for generating the test signals, said signal generating means receiving command functions from said control computer via a digital I/O card having a plurality of outputs electrically connected to a low frequency module, a low band module, a high band up converter module and a modulation module electrically connected to each other, said modulation module providing a test signal output electrically connected to said power amplifier of said transmitting module and said power amplifier being electrically connected to low, mid and high band antennas of said plurality of antennas, said antennas emitting a test signal radiated at the plurality of antennas installed in the aircraft; and a control computer electrically connected to said signal generating means, said control computer receiving commands from said hand-held computer via said radio receiver of said transmitting module and programming said signal generating means for selected output.

* * * * *